United States Patent
Mandell et al.

(10) Patent No.: US 6,750,747 B2
(45) Date of Patent: Jun. 15, 2004

(54) PROXIMITY SAFETY SWITCH SUITABLE FOR USE IN A HAIR DRYER FOR DISABLING OPERATION

(75) Inventors: Joan Golden Mandell, West Hills, CA (US); Lee Jay Mandell, West Hills, CA (US)

(73) Assignee: LJM Associates, Inc., Canoga Park, CA (US)

( * ) Notice: Subject to any disclaimer, the term of this patent is extended or adjusted under 35 U.S.C. 154(b) by 0 days.

(21) Appl. No.: 10/230,749

(22) Filed: Aug. 29, 2002

(65) Prior Publication Data

US 2004/0041684 A1 Mar. 4, 2004

(51) Int. Cl.$^7$ ................................................. H01H 9/00
(52) U.S. Cl. .............................. 335/205; 34/96; 200/219
(58) Field of Search ................................. 335/205, 206, 335/207; 34/96; 392/385; 219/200

(56) References Cited

U.S. PATENT DOCUMENTS

| | | | |
|---|---|---|---|
| 3,622,922 A | * 11/1971 | Mogi ............................. | 335/2 |
| 3,713,056 A | * 1/1973 | Hosokawa .................... | 335/206 |
| 4,130,955 A | * 12/1978 | Baumgartner et al. ......... | 38/82 |
| 4,198,557 A | * 4/1980 | Crowley ....................... | 392/384 |
| 4,319,712 A | * 3/1982 | Bar .............................. | 236/47 |
| 4,523,083 A | * 6/1985 | Hamilton ..................... | 219/433 |
| 4,685,229 A | 8/1987 | Moravek et al. | |
| 4,700,049 A | 10/1987 | Rubin | |
| 4,751,485 A | * 6/1988 | Fujio et al. .................. | 335/206 |
| 4,879,443 A | 11/1989 | Carlucci et al. | |
| 4,914,376 A | * 4/1990 | Meyer ......................... | 323/352 |
| 5,438,763 A | * 8/1995 | Yang .............................. | 34/90 |
| 5,841,356 A | * 11/1998 | Woodruff et al. ............ | 340/635 |
| 6,060,969 A | * 5/2000 | Hufgard et al. .............. | 335/207 |
| RE36,995 E | * 12/2000 | Andis ............................. | 34/97 |
| 6,188,837 B1 | 2/2001 | Kwan | |
| 6,205,674 B1 | 3/2001 | Kaizuka | |
| 6,393,718 B1 | * 5/2002 | Harris et al. .................... | 34/96 |
| 6,431,513 B1 | 8/2002 | Rosen | |

FOREIGN PATENT DOCUMENTS

WO     WO 8203520 A   * 10/1982   ........... D06F/75/26

* cited by examiner

*Primary Examiner*—Lincoln Donovan
*Assistant Examiner*—Bernard Rojas
(74) *Attorney, Agent, or Firm*—Lee J. Mandell

(57) ABSTRACT

A safety switch apparatus for disabling operation of a hand-carried appliance, e.g., a hair dryer, during periods of nonuse such as when the appliance is put down on a prescribed surface or placed in a non-functional position such as being held under a user's arm. In preferred embodiments, a sensor, e.g., a hall effect sensor, a magnetoresistive sensor, a reed switch, or the like, is coupled to control circuitry within the appliance to remove power from portions of the device, e.g., its motor and/or heater, when the appliance is proximate to an externally-provided magnetic field preferably provided from a magnetic element typically contained within a pad placeable on a work surface, within the work surface, or a wearable piece of clothing. In a further feature of a preferred embodiment, power is restored when the apparatus is removed from the magnetic field. However after a sustained detection period, operation ceases.

22 Claims, 4 Drawing Sheets

PROXIMITY SAFETY SWITCH SUITABLE FOR USE IN A HAIR DRYER FOR DISABLING OPERATION

FIELD OF THE INVENTION

The present invention is generally directed to a safety switch for disabling operation of a hand-carried appliance, e.g., a hair dryer, during detected periods of non-use, e.g., when the appliance is put down, when the appliance is held in a non-functional position, etc.

BACKGROUND OF THE INVENTION

Since the introduction of the hand-held hair dryer many features have been added to expand the utility of the product and improve its function. Typically, hair dryers now have ground fault interrupters (GFIs) on their power plugs for safety and may have shut offs for when they overheat. Multiple speeds and heat settings are now included on most models and some have a special one-touch cold setting. Numerous attachments have been added such as diffusers and cones to focus the heat as well as to add volume. Also many dryers now come in decorator colors with retractable cords and wall mountings. For real aficionados, there are also quiet dryers and ionic dryers for quicker drying. All of these features have made drying one's hair safer, easier, and more efficient.

However, for anyone who has ever used a hand-held hair dryer, the real problem is how to shift from preparing the hair for receiving the heat with only two hands. The usual scenario is to turn off the dryer and put it down. Then with one hand holding the brush, the other hand is used to wrap the intended section of hair around the brush in readiness to receive the heat. Once that is completed, while holding the brush in one hand, one must then pick up the dryer with the free hand and with that same hand that is used to hold the dryer to somehow move one's fingers nimbly around the dryer to flip the power switch to again turn on the dryer. Once that section of hair is satisfactorily dry, the process begins again. For women with anything other than very short hair and especially those who are trying to use the dryer to straighten hair this is an arduous, often exhausting process. For older people, especially those with beginning or moderate forms of arthritis, it is almost impossible to navigate the use of a hair dryer in any effective way. If one puts the dryer down on the counter without turning it off first, it will, within seconds, begin to move around wildly, at best blowing items around on the counter and at worst, falling off the counter onto the floor. At many beauty salons, the stylist often holds the activated dryer under his/her arm pit which can result in the air blowing into the face of the adjoining client. The only product known to the inventors of the present invention to even partially address this problem comprises a hair dryer with a wall mounted bracket that contains a mechanical power switch that removes power from the hair dryer when the hair dryer is mechanically snapped into the bracket.

SUMMARY OF THE INVENTION

The present invention is directed to a safety switch apparatus for disabling operation of a hand-carried appliance, e.g., a hair dryer, during periods of nonuse such as when the appliance is put down on a prescribed surface or placed in a non-functional position such as when it is held under a user's arm. In preferred embodiments, a sensor, e.g., a hall effect sensor, a magnetoresistive sensor, a reed switch, or the like is coupled to control circuitry within the appliance to remove power from portions of the device, e.g., its motor and/or heater, when the appliance is proximate to an externally-provided magnetic field preferably provided from a magnetic element typically contained within a pad placeable on a work surface, e.g., a counter top.

In accordance with a preferred embodiment suitable for use with a hair dryer wherein the hair dryer comprises a motor and a heater, a safety system comprises (1) a sensor for detecting presence of an externally-provided magnetic field, e.g., a hall effect sensor, a magnetoresistive sensor, and a reed switch or the like; and (2) control and switch circuitry for alternatively supplying or removing power to/from the motor and/or heater; wherein the sensor is coupled to the control circuitry and in response to a detected magnetic field, the control and switch circuitry removes power from the motor and/or heater.

In a significant aspect of a preferred embodiment, said control and switch circuitry supplies power to the motor and/or heater in response to the absence of a magnetic field. Additionally, preferred embodiments additionally remove power from the control circuitry after a magnetic field is detected for a prescribed period.

In a further aspect of a preferred embodiment, the externally-provided magnetic field is supplied from a planar member suitable for placement on a work surface. Typically, the planar member is a conventional "refrigerator magnet" and is preferably contained with a multilayer structure having soft and/or elastic outer layers similar to a conventional "mouse pad".

In a still further aspect of a preferred embodiment, the externally-provided magnetic field may alternatively be provided by a magnetic element built into a work surface or contained within a wearable piece of clothing.

In an alternative implementation of the present invention, the sensor may be a tuned circuit which is sensitive to the proximity of a metallic, e.g., ferrous, element and the metallic element is located in an externally-provided planar member, a work surface or within an article of clothing.

The novel features of the invention are set forth with particularity in the appended claims. The invention will be best understood from the following description when read in conjunction with the accompanying drawings.

DETAILED DESCRIPTION OF THE PREFERRED EMBODIMENTS

The following description is of the best mode presently contemplated for carrying out the invention. This description is not to be taken in a limiting sense, but is made merely for the purpose of describing the general principles of the invention. The scope of the invention should be determined with reference to the claims.

The present invention is directed to a safety switch apparatus for disabling operation of a hand-carried appliance, e.g., a hair dryer, during periods of nonuse such as when the appliance is put down on a prescribed surface or placed in a non-functional position such as when it is held under a user's arm. In preferred embodiments, a sensor, e.g., a hall effect sensor, a magnetoresistive sensor, a reed switch, or the like, is coupled to control circuitry within the appliance to remove power from portions of the device, e.g., its motor and/or heater, when the appliance is proximate to an externally-provided magnetic field preferably provided from a magnetic element typically contained within a pad placeable on a work surface (for example a counter top), a magnet contained within the work surface, or a wearable piece of clothing.

Figure 1:
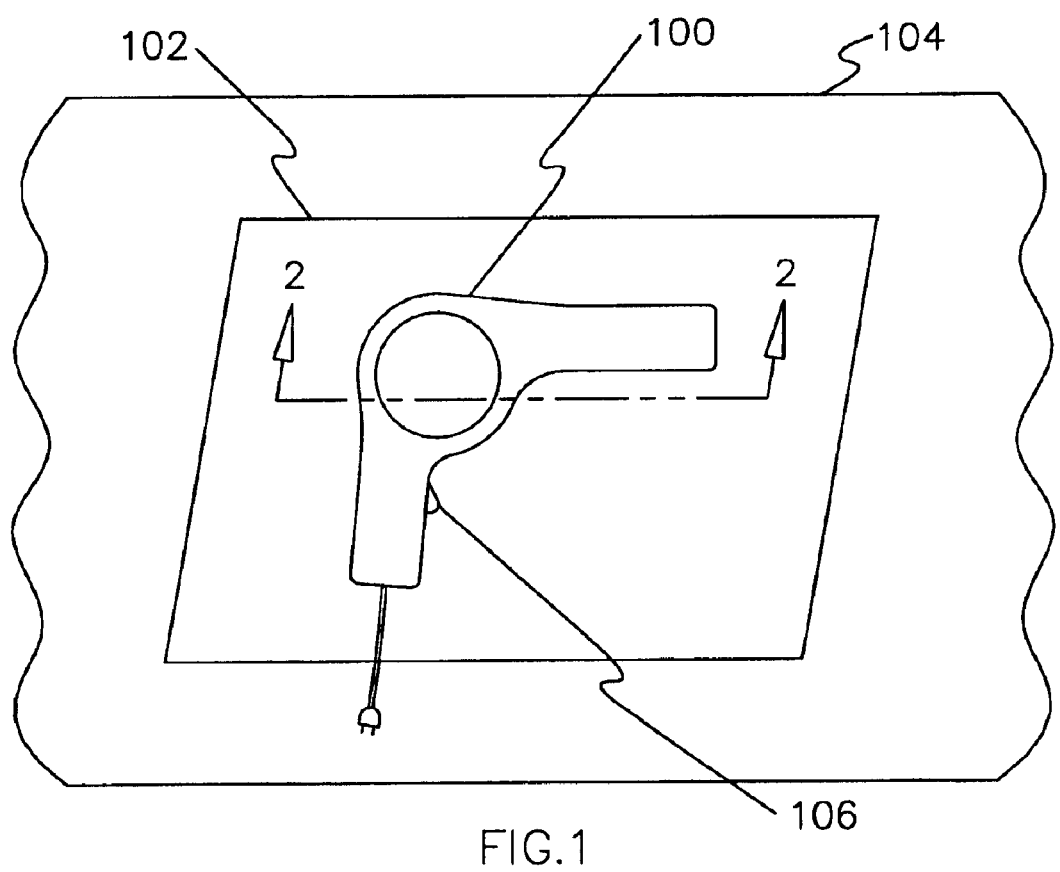
FIG. 1 is a perspective view of a hair dryer which contains an exemplary switch apparatus of the present invention positioned on a detectable pad on a work surface, e.g., a counter top.
Figure 5:
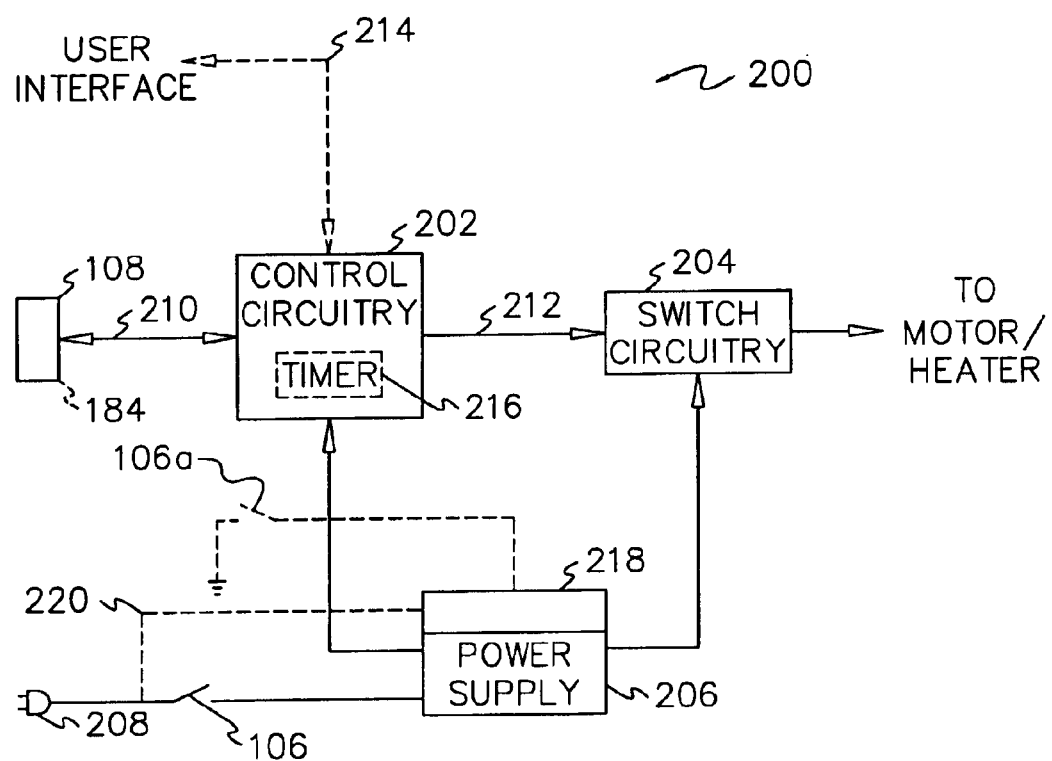
FIG. 5 is a block diagram of the safety switch apparatus of the present invention for removing/restoring power from/to a hand-carried apparatus, e.g., a hair dryer, in response to a detected material.

FIG. 1 shows an exemplary hand-carried appliance, e.g., hair dryer 100, containing the safety switch apparatus 200 of the present invention (see FIG. 5). Hair dryer 100 is shown located on a pad 102 on top of a work surface 104, e.g., a counter top. In a conventional operation, a hair dryer is typically activated using one or more on/off switches, used to control the fan motor speed and heater heat level. In embodiments of the present invention, this operation is altered such that once the hair dryer 100 is activated using on/off switch 106, safety switch apparatus 200 disables power to the motor and/or heater once it senses proximity of the pad 102 to the dryer 100. Preferably as described further below, the power to the motor and/or heater is re-enabled if the dryer 100 is removed from the pad 102. However, if the dryer remains on the pad 102 for more than a prescribed length of time, e.g., 5 minutes, the safety switch apparatus 200 removes its own power. Afterwards, the operational cycle will only restart if the on/off switch 106 is again activated.

Figure 2:
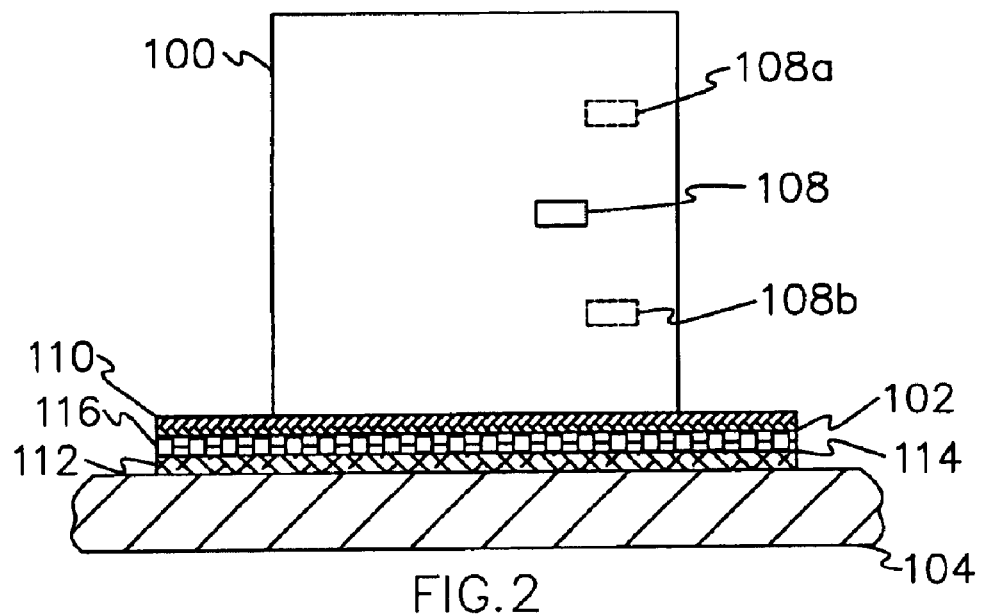
FIG. 2 is a cross sectional view of the dryer of FIG. 1 showing the switch of the present invention.

FIG. 2 shows a cross sectional view of that shown in FIG. 1 which additionally shows an exemplary construction of pad 102 and a sensor 108 which is positioned within the dryer 100 to sense the presence of detectable material within the pad 102. The pad 102 is preferably constructed as multiple planar outer layers, e.g, top layer 110 and bottom layer 112, which surround an inner planar layer 114 of detectable material. Preferably, the pad 102 and accordingly each layer 110, 112, 114 is pliable and the outer layers 110, 114 are soft and resilient so as to not harm either the work surface 104 or the dryer 100 with which it makes contact. Optionally, the top layer 110 is imprinted with an aesthetically pleasing pattern or color. Accordingly, pad 102 resembles a conventional "mouse pad".

In a first embodiment, the sensor 108 is a magnetic sensor, e.g., a hall effect sensor, a magnetoresistive sensor (including a giant magnetoresistive sensor), a reed switch, or the like, and the detectable material that forms the inner planar layer 114 is a magnetic material similar to that used in a "refrigerator magnet". Alternatively in a second embodiment, the sensor 108 may be implemented as a tuned circuit, e.g., an oscillator similar to that found in a stud sensor, a traffic sensor, a metal detector or the like, whose frequency alters with the presence of a metallic material, e.g., a ferrous material. Accordingly in the second embodiment, the detectable material that forms the inner planar layer 114 is such a metallic or ferrous material.

In the cross sectional view of FIG. 2, the sensor 108 is shown centrally located within the dryer 100 so that when the dryer 100 is set down on the pad 102, its separation from the inner planar layer 114 is essentially independent of whether the right or left side of the dryer 100 is placed downward toward the pad 100. Alternatively, sensor 108 may instead be formed from multiple sensors, e.g., sensors 108a or 108b, to further minimize separation of the sensor 108 from the inner planar layer 114 and thus increase its detection capability. Finally, if the sensitivity of the sensor 108 is sufficient and/or if the quantity of detectable material is increased, e.g., to increase the magnitude of the magnetic field, a single sensor may be used in positions corresponding to 108a, 108, 108b or anywhere in-between.

Figure 3:
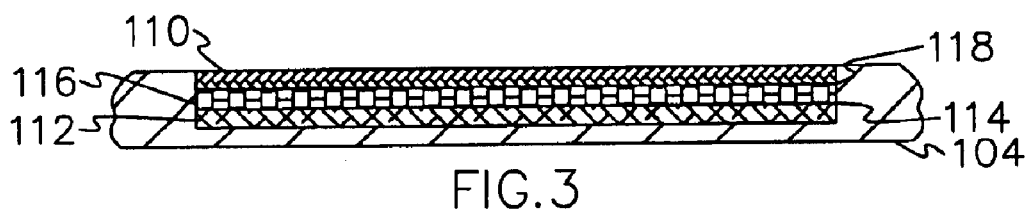
FIG. 3 is a cross sectional view of a work surface having a pad formed within a cutout on its upper surface.
Figure 4:
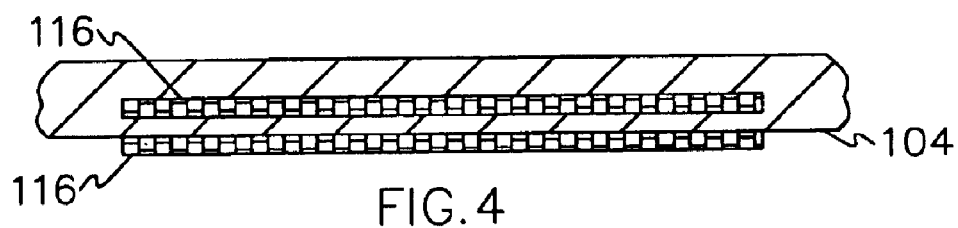
FIG. 4 is a cross sectional view of a work surface having detectable material contained within or below the surface.

While the movable, i.e., relocatable, configuration of FIG. 2 is presently preferred, FIGS. 3 and 4 show alternative techniques for presenting detectable material 116. Characteristic of these embodiments, is that the fixed location permits the use of larger amounts of detectable material which increases the detection capability of embodiments of the present invention. In FIG. 3, a cutout 118 is formed in the work top 104 and a pad structure, similar to that described in relation to FIG. 2, is located within. Alternatively in FIG. 4, detectable material 116 may be formed within or beneath the work surface 104.

Preferably, pad 102 is flexible and thus it may be formed as a wearable piece of clothing, e.g., which can be held proximate to the user's arm pit, lap, etc., such that the user can disable operation of the dryer 100 just by placing the dryer 100 proximate to the wearable piece of clothing.

Figure 6:
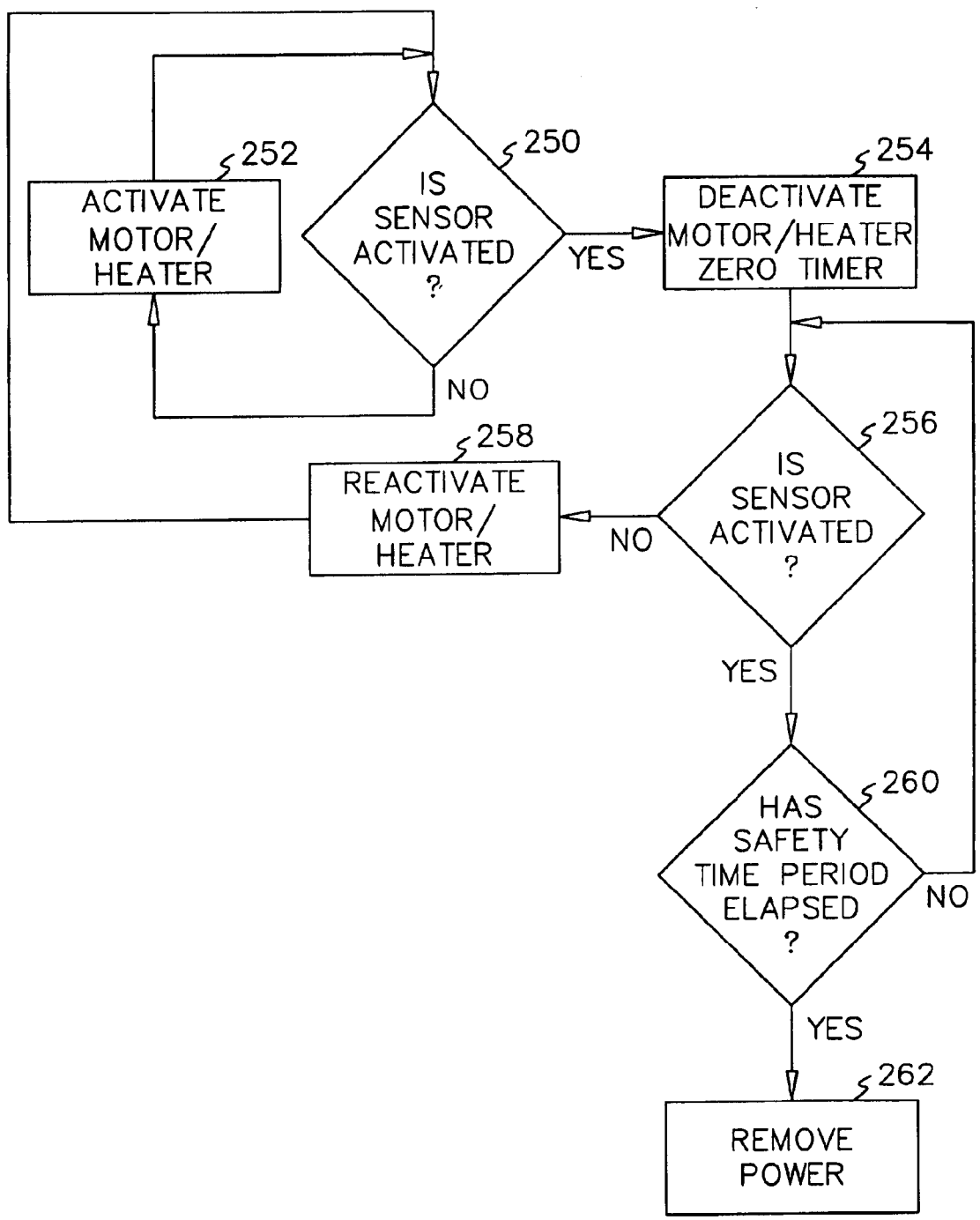
FIG. 6 is a simplified exemplary flow chart of the operation of the safety switch apparatus of the present invention.

FIG. 5 shows a simplified block diagram of the safety switch apparatus 200 of the present invention. The safety switch apparatus 200 is primarily comprised of a sensor 108, control circuitry 202, switch circuitry 204, power supply 206, and on/off switch 106. In operation, power is received from AC power plug 208 and once on/off switch 106 is activated, power supply 206 is activated which in turn supplies power control circuitry 202 (and sensor 108 when an active sensor, e.g., a hall effect sensor, is used) and switch circuitry 204. Control circuitry 202, preferably a microcontroller, FPGA, a custom IC, or the like, preferably operates according to the exemplary flow chart of FIG. 6. Initially as noted in block 250, control circuitry 202 queries sensor 108 via line 210 for the presence of the detectable material 116, e.g., a magnetic material. If the detectable material 116 is not sensed, block 252 is executed and control line 212 is enabled to cause switch circuitry 204, typically a semiconductor switch, e.g., a silicon controlled rectifier (SCR), a mechanical relay, e.g., a contactor, or the like, to provide operating power, typically AC, to the motor and/or heater of the dryer 100. When the dryer 100 is positioned proximate to the detectable material 116, e.g, contained within pad 102, the sensor 108 is activated and in response, control circuitry 202 disables control line 212 in block 254 causing the switch circuitry 204 to remove power from the motor and/or heater (optionally, this determination is made via optional user interface 214). Preferably, the disabling and enabling of the control line 212 is essentially concurrent with the detection and loss of detection of the detectable material. Accordingly, it is preferable that this response occur promptly, i.e., within a time period of 5 seconds of the detection status change. More preferably, this status changes occurs immediately, i.e., within a time period of 1 second or less following detection of the detectable material, even more preferably 0.5 seconds or less and most preferably 0.25 seconds or less. Optionally, a timer 216, preferably within the control circuitry 202, is zeroed at this step. Preferably in block 256, the control circuitry 202 continues to monitor the continued presence of the detectable material 116. Should the sensor 108 no longer be activated, the motor and/or heater is re-activated in block 258 by re-enabling the switch circuitry 204 via control line 212. Optionally, if sensor 108 continues to be activated, block 260 is executed and the timer 216 is compared to a prescribed safety time period, e.g., 5 minutes (optionally, programmable, e.g., to 15 seconds, 30 seconds, 1 minute, 5 minutes, via user interface 214). If the timer 216 has not reach the prescribed limit, the process loops back to block 256. When the prescribed limit is reached, block 262 is executed and power is removed from the control 202 and switch 204 circuitry as well. To enable this optional mode of operation, power supply 206 additionally comprises power maintenance circuitry 218, e.g., a relay or other circuitry, to maintain its power via line 220 upon momentary activation of on/off switch 106a. However, once block 262 is executed this power maintenance circuitry 218 is deactivated.

Accordingly, what has been shown is directed to a safety switch system for disabling operation of a hand-carried appliance during periods of nonuse. While the invention has been described by means of specific embodiments and applications thereof, it is understood that numerous modifications and variations could be made thereto by those skilled in the art without departing from the spirit and scope of the invention. For example, while the present invention has been specifically described for use with a hand-held hair dryer, it is recognized that the safety switch system of the present invention will be useful with other hand-carried appliances as well. It is therefore to be understood that within the scope of the claims, the invention may be practiced otherwise than as specifically described herein.

What is claimed is:

1. A safety system suitable for use in a hand-carried hair dryer wherein said hair dryer comprises a motor and a heater, said system comprising:

a sensor for detecting presence of an externally-provided magnetic field; and control and switch circuitry for alternatively supplying or removing power to/from said motor and/or heater;

wherein said sensor is coupled to said control circuitry and in response to a detected magnetic field, said control and switch circuitry promptly removes power from said motor and/or heater.

2. The system of claim 1 wherein said control and switch circuitry supplies power to said motor and/or heater when said sensor ceases to detect a magnetic field.

3. The system of claim 1 wherein after a prescribed period where a magnetic field is detected, operation of the hair dryer ceases.

4. The system of claim 1 wherein said sensor is selected from the group comprising a hall effect sensor, a magnetoresistive sensor, and a reed switch.

5. The system of claim 1 additionally comprising a planar member suitable for placement on a work surface for providing said externally-provided magnetic field.

6. The system of claim 5 wherein said planar member is comprised of:

a first outer planar layer;

a second outer planar layer; and a magnetic planar layer contained with said first and second outer planar layers.

7. The system of claim 1 additionally comprising a magnetic element built into a work surface for providing said externally-provided magnetic field.

8. A safety system suitable for use in a hand-carried appliance, said system comprising:

a sensor for detecting presence of an externally-provided magnetic field; and control and switch circuitry comprising a first power consuming portion of said hand-carried appliance for alternatively supplying or removing power from at least a second power consuming portion of said hand-carried appliance;

wherein said sensor is coupled to said control circuitry and in response to a detected magnetic field, said control and switch circuitry promptly removes power from said second power consuming portion of said hand-carried appliance.

9. The system of claim 8 wherein said control and switch circuitry supplies power to said second power consuming portion of said hand-carried appliance when said sensor ceases to detect a magnetic field.

10. The system of claim 8 wherein after a prescribed period where a magnetic field is detected, operation of the hand-carried appliance ceases.

11. The system of claim 8 wherein said sensor is selected from the group comprising a hall effect sensor, a magnetoresistive sensor, and a reed switch.

12. The system of claim 8 additionally comprising a planar member suitable for placement on a work surface for providing said externally-provided magnetic field.

13. The system of claim 12 wherein said planar member is comprised of:

a first outer planar layer;

a second outer planar layer; and a magnetic planar layer contained with said first and second outer planar layers.

14. The system of claim 8 additionally comprising a magnetic element built into a work surface for providing said externally-provided magnetic field.

15. A safety system suitable for use in a hand-carried appliance, said system comprising:

a sensor for detecting presence of an externally-provided detectable metallic element; and control and switch circuitry comprising a first power consuming portion of said hand-carried appliance for alternatively supplying or removing power from at least a second power consuming portion of said hand-carried appliance;

wherein said sensor is coupled to said control circuitry and in response to detecting said metallic element, said control and switch circuitry promptly removes power from said second power consuming portion of said hand-carried appliance.

16. The system of claim 15 wherein said control and switch circuitry supplies power to said second power consuming portion of said hand-carried appliance when said sensor ceases to detect said metallic element.

17. The system of claim 15 wherein after a prescribed period where said metallic element is detected, operation of the hand-carried appliance ceases.

18. The system of claim 15 wherein said detectable metallic element is a ferrous material.

19. The system of claim 15 wherein said sensor is a tuned circuit which is responsive to the proximity of said externally-provided detectable metallic element.

20. The system of claim 15 additionally comprising a planar member suitable for placement on a work surface for providing said externally-provided metallic element.

21. The system of claim 20 wherein said planar member is comprised of:

a first outer planar layer;

a second outer planar layer; and a metallic planar layer contained with said first and second outer planar layers.

22. The system of claim 15 additionally comprising metal built into a work surface for providing said detectable metallic element.

* * * * *